United States Patent
Hong et al.

(10) Patent No.: US 11,123,837 B2
(45) Date of Patent: Sep. 21, 2021

(54) METHOD OF REMOVAL OF SHARP CORNERS FROM DIFFUSER PLATE

(71) Applicant: Applied Materials, Inc., Santa Clara, CA (US)

(72) Inventors: Ilyoung Hong, San Jose, CA (US); Lai Zhao, Campbell, CA (US); Jianhua Zhou, Campbell, CA (US); Robin L. Tiner, Santa Cruz, CA (US); Gaku Furuta, Sunnyvale, CA (US); Shinichi Kurita, San Jose, CA (US); Soo Young Choi, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 762 days.

(21) Appl. No.: 15/853,548

(22) Filed: Dec. 22, 2017

(65) Prior Publication Data
US 2019/0193233 A1 Jun. 27, 2019

(51) Int. Cl.
*B24B 19/00* (2006.01)
*C23C 16/44* (2006.01)
*H01J 37/32* (2006.01)
*C23C 16/455* (2006.01)
*B24B 1/04* (2006.01)

(52) U.S. Cl.
CPC ........ *B24B 19/009* (2013.01); *C23C 16/4407* (2013.01); *C23C 16/45559* (2013.01); *H01J 37/3244* (2013.01); *B24B 1/04* (2013.01)

(58) Field of Classification Search
CPC .... B24B 7/16; B24B 1/04; B24B 5/06; B24B 5/12; B24B 5/40; B24B 5/48; B24B 9/007; B24B 27/0641; B24B 33/00; B24B 33/02; B24B 33/025; B24B 9/00; B24B 9/002; B24B 9/005; B24B 23/02; H01J 37/3244; C23C 16/4407; C23C 16/4559; B08B 9/027
USPC ....................................... 451/51; 156/345.34
See application file for complete search history.

(56) References Cited

U.S. PATENT DOCUMENTS

| | | | |
|---|---|---|---|
| 5,243,790 A * | 9/1993 | Gagne | B24B 7/22 451/528 |
| 5,616,208 A * | 4/1997 | Lee | H01L 21/67766 156/345.24 |
| 5,980,764 A | 11/1999 | Yoon | |
| 8,308,530 B2 * | 11/2012 | McDowell | B24B 33/02 451/464 |
| 2003/0188685 A1 | 10/2003 | Wang et al. | |
| 2008/0302303 A1 * | 12/2008 | Choi | C23C 16/45565 118/723 R |

(Continued)

OTHER PUBLICATIONS

STIC search results (Year: 2020).*

*Primary Examiner* — Orlando E Aviles
*Assistant Examiner* — Alberto Saenz
(74) *Attorney, Agent, or Firm* — Patterson + Sheridan LLP

(57) ABSTRACT

Methods for manufacturing a diffuser plate for a PECVD chamber are provided. The methods provide for applying a compliant abrasive medium to round the sharp edges at corners of the output holes on a contoured downstream side of a gas diffuser plate. By rounding the edges of the output holes reduces the flaking of deposited materials on the downstream side of the gas diffuser plate and reduces the amount of undesirable particles generated during the PECVD deposition process.

23 Claims, 8 Drawing Sheets

(56) References Cited

U.S. PATENT DOCUMENTS

2011/0198034 A1\* 8/2011 Sun ........................... C23C 4/18
156/345.34

\* cited by examiner

METHOD OF REMOVAL OF SHARP CORNERS FROM DIFFUSER PLATE

BACKGROUND OF THE DISCLOSURE

Field

Embodiments of the present disclosure generally relate to a method of manufacturing a diffuser plate for a chemical vapor deposition (CVD) system designed to reduce particles during the deposition process.

Description of the Related Art

Plasma enhanced chemical vapor deposition (PECVD) is a deposition method that has long been used to deposit films onto substrates. PECVD has recently been used to deposit films on large area substrates such as solar panel substrates, flat panel display substrates, and large area thin film transistor substrates. Market forces continue to drive down the cost of flat panel displays while increasing the size of the substrate. Substrate sizes greater than 1 square meter are not uncommon in flat panel display processes.

The size of the diffuser plates or showerheads used in the PECVD deposition process has kept up with the increased size of the large area substrates. The increased size of the diffuser plates has resulted in many more gas diffuser plate designs with many more gas distribution holes and contours integrated into the downstream side of the diffuser plate to enhance plasma uniformity and the uniformity of deposited material across the substrate. Deposition of material on the downstream side of the diffuser plate provides a source of particles during the deposition process that leads to decrease yields of the substrates. Reducing flaking of deposited materials on the downstream side of the diffuser plate and therefore reducing particles from the deposited materials on the diffuser plate can be a challenge.

With the increasing of the gas diffuser plate size, number of gas distribution holes and the contoured downstream side of the distribution plate, there is a need in the art for an improved method for manufacturing such a gas diffuser plate.

SUMMARY

Embodiments of a method for manufacturing a diffuser plate or a showerhead for distributing gas in a processing chamber are provided. It should be noted that the terms diffuser plate, gas distribution plate and showerhead are all interchangeable terms and each may be used throughout this disclosure and each have the same meaning. In one embodiment, a method of forming a diffuser plate comprising removing material with an abrasive member from a non-planar downstream surface of a diffuser plate to form a surface with a radius at an edge of each of a plurality of holes formed at the non-planar downstream surface.

In another embodiment, a method of forming a diffuser plate comprises forming a plurality of holes through the diffuser plate from an upstream side of the diffuser plate to a downstream side of the diffuser plate, removing diffuser plate material from the downstream side of the diffuser plate forming a non-planar downstream surface, and removing material with an abrasive member from the non-planar downstream surface of the diffuser plate to form a surface with a radius at an edge of each of a plurality of holes formed at the non-planar downstream surface.

In another embodiment, a method of forming a diffuser plate comprises forming a plurality of holes through the diffuser plate from an upstream side of the diffuser plate to a downstream side of the diffuser plate, removing diffuser plate material from the downstream side of the diffuser plate forming contoured corners at an edge of the holes, and removing material with an abrasive member from the downstream side of the showerhead to form a surface with a radius at the edge of each of the contoured corners.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure generally comprises an improved method for manufacturing a diffuser plate for a PECVD chamber. The method provides for removing material using a compliant abrasive medium to round the sharp edges at corners of the output holes on the contoured downstream side of a gas diffuser plate. Rounding the edges of the output holes reduces the flaking of deposited materials on the downstream side of the gas diffuser plate and reduces the amount of undesirable particles during the PECVD deposition process.

The present disclosure will be illustratively described below in reference to a PECVD system configured to process large area substrates such as a PECVD system available from AKT, a division of Applied Materials, Inc., Santa Clara, Calif. However, it is to be understood that the disclosure has utility in other system configurations such as those utilized to process small or round substrates. The disclosure also has utility in processing systems manufactured by other manufacturers.

Figure 1:
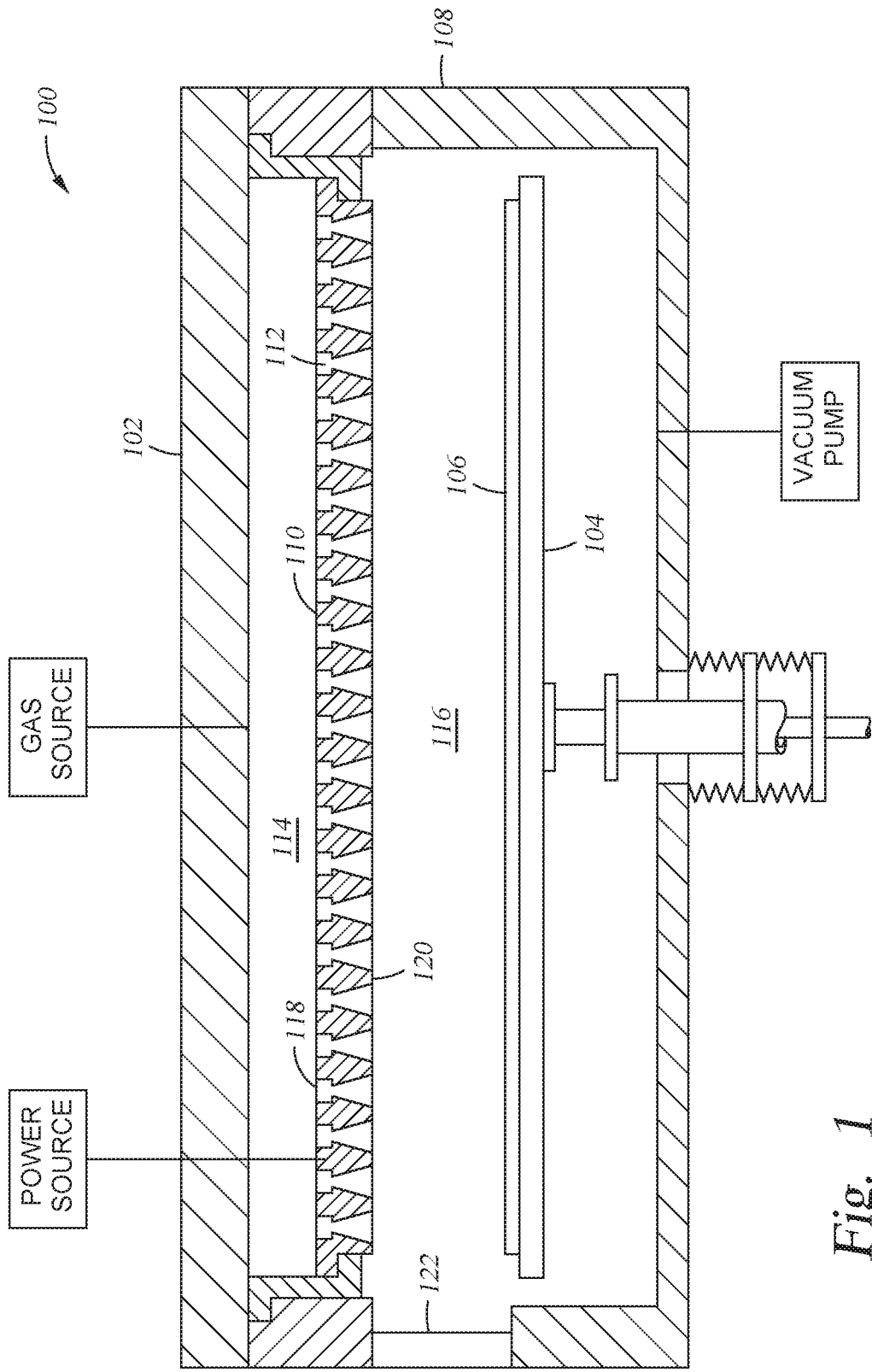
FIG. 1 is a schematic cross sectional view of a processing chamber according to one embodiment.

FIG. 1 is a schematic cross sectional view of a processing chamber 100 according to one embodiment. The processing chamber 100 comprises chamber body having a chamber lid 102 and chamber walls 108. Within at least one wall 108, one or more slit valve openings 122 may be present to permit insertion of substrates 106 to the processing space 116 and removal of substrates 106 from the processing space 116. The processing space 116 may be bound by the slit valve opening 122, chamber walls 108, substrate 106, and diffuser plate 110. In one embodiment, the diffuser plate 110 may be biased by a power source. The substrate 106 may be disposed on a support assembly 104 that may translate up and down to raise and lower the substrate 106 as necessary.

Gas may be introduced to an area between the diffuser plate 110 and the lid assembly 102 called the plenum 114. The gas may be evenly distributed within the plenum 114 due to the presence of gas passages 112 that extend from an upstream side 118 of the diffuser plate through to the downstream side 120. The gas passages, as will be described below, may be designed to create a substantially uniform gas pressure within the plenum and a more uniform distribution of gas into processing space 116.

Figure 2:
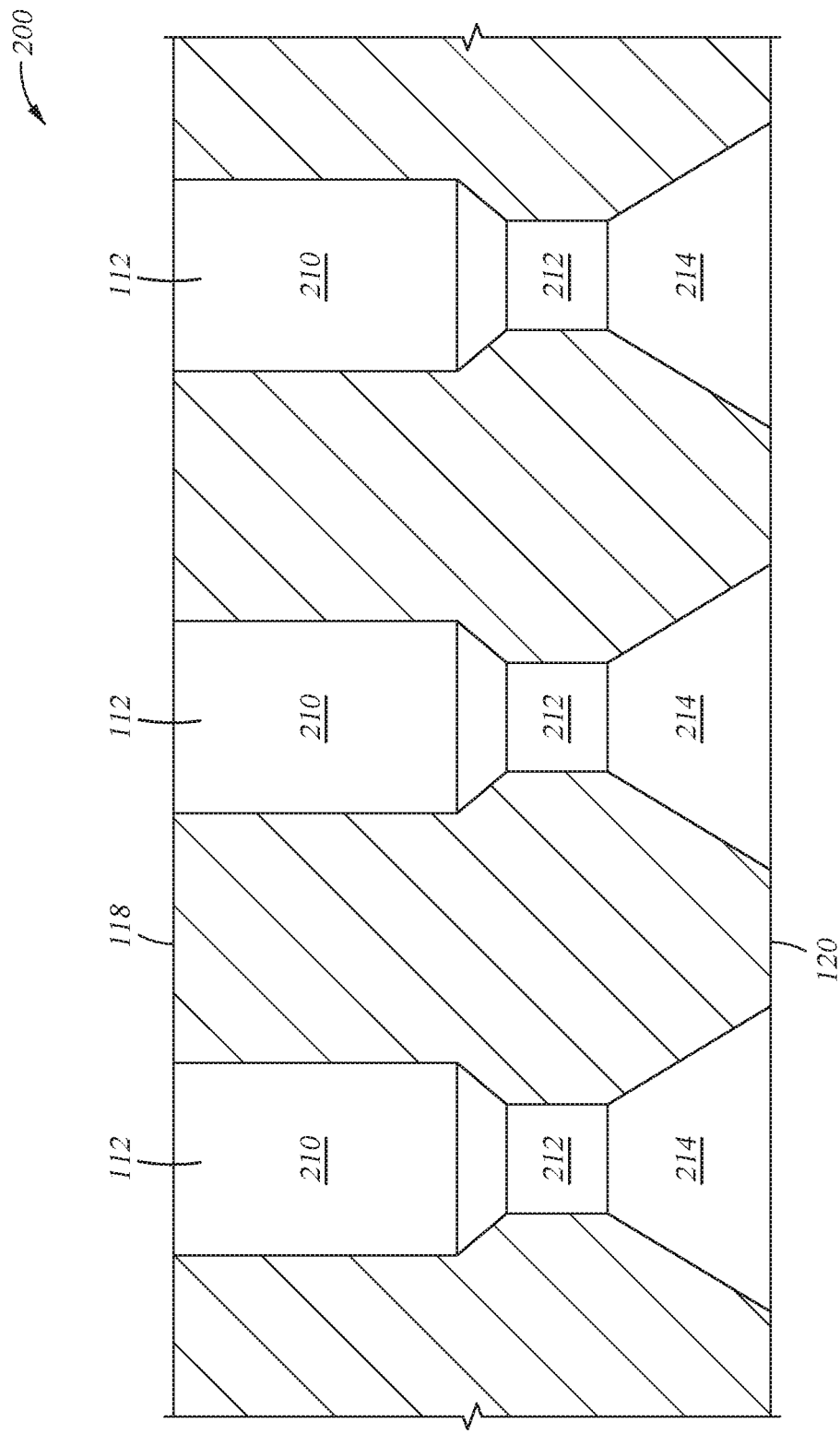
FIG. 2 depicts a cross-sectional schematic view of a portion of a diffuser plate.

FIG. 2 is a schematic cross sectional view of a portion of diffuser plate 110 of FIG. 1. The diffuser plate portion 200 comprises an upstream side 118 that would be adjacent to the plenum and a downstream side 120 that would be adjacent the processing space during processing. A plurality of gas passages 112 are present within the diffuser plate 110 extending between the upstream side 118 and the downstream side 120.

Each gas passage 112 comprises a top bore 210, a choke 212, and a hollow cathode cavity 214. The top bore 210 is coupled with the upstream side 118 of the diffuser plate 110 while the hollow cathode cavity 214 is coupled with the downstream side 120 of the diffuser plate 110. The choke 212 is coupled between the hollow cathode cavities 214 and the top bores 210.

The gas passages 112 may be formed by drilling a bore into the diffuser plate 110 from the upstream side 118 and drilling another bore into the diffuser plate 110 from the downstream side 120 such that the two bores are coupled together. The location where the two bores meet forms the choke 212 of the diffuser plate 110.

The choke 212 functions to permit the gas distributed within the plenum to be evenly distributed across the upstream side 118 of the diffuser plate 110 by narrowing the channel through which the gas may flow through the diffuser plate. The narrowed channel of choke 212 backs up the gas and thus spreads out the gas across the upstream side 118 of the diffuser plate 110 so that an equal amount of gas may flow through each gas passage 112. In one embodiment, the chokes 212 may all have the same height and width. In another embodiment, the chokes 212 may have varying heights and/or widths. Additionally, the chokes 212 may be spaced the same or different distances from the upstream side 118 of the diffuser plate 110.

The hollow cathode cavities 214 may be cone or cylinder shaped or a combination of both. The hollow cathode cavities 214 are sized to permit the ignition of plasma within the hollow cathode cavities 214. In other words, plasma may be ignited within the diffuser plate 110, itself, rather than within a processing space. By igniting the plasma within the hollow cathode cavities 214, the shape of the plasma may be controlled because the shape and/or size of the hollow cathode cavities 214 may affect the shape and/or intensity of the plasma within the chamber.

Under conditions where the gas passages 112 are substantially identical across the diffuser plate 110, it has been found that the area of the center of the substrate may have a greater amount of deposition compared to the remainder of the substrate. It has also been discovered that the area of the substrate adjacent to the slit valve opening 122 may have a greater amount of deposition compared to the remainder of the substrate, although the amount of deposition occurring on the substrate adjacent to the slit valve may be less than the amount of deposition occurring at the center of the substrate.

Figure 3:
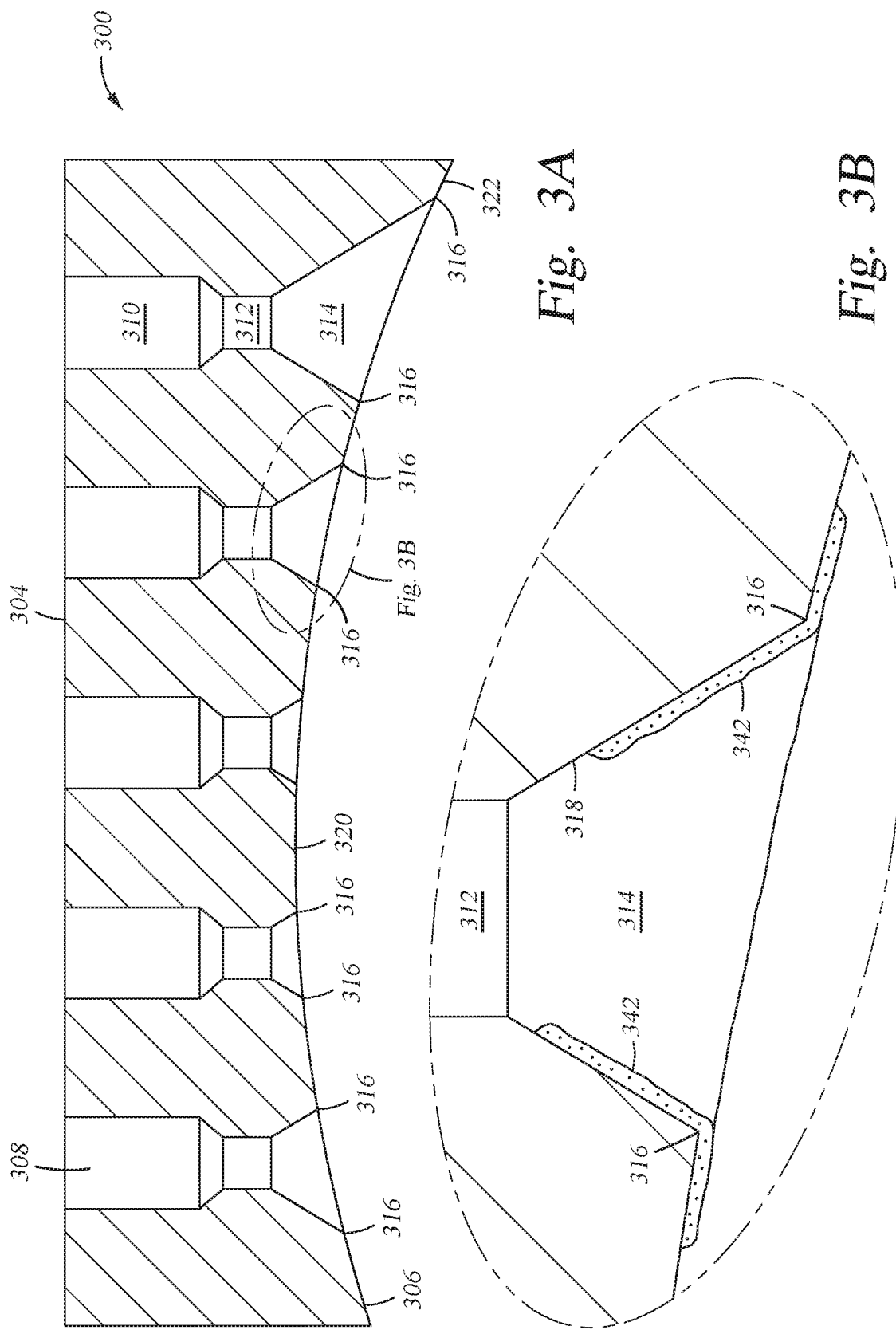
FIG. 3A is a schematic cross-sectional view of a portion of a diffuser plate according to another embodiment.
FIG. 3B is a close-up cross-sectional schematic view of a hollow cathode cavity depicted in FIG. 3A.

To compensate for the uneven deposition, the surface area and/or volume of the hollow cathode cavities 214 may be adjusted across the downstream side 120 of diffuser plate 110. It has been found that the uniformity and film thickness can be greatly improved by gradually increasing the diameters and depths of the hollow cathode cavities 214, which extend to the downstream side 120 of diffuser plate 110. FIG. 3A shows a non-planar diffuser plate 300 with a contoured downstream side 306 that provides for gradually increasing diameters of the hollow cathode cavities 314 from the center portion 320 of diffuser plate 300 to the outer portion 322 of diffuser plate 300.

The top bore 310 and the choke 312 for each gas passage extending between the upstream surface 304 and the downstream surface 306 are substantially identical. The hollow cathode cavities 314, however, may be different across the diffuser plate 300. The hollow cathode cavities 314 closest to the center portion 320 of the diffuser plate may have a smaller surface area, diameter and/or volume as compared to the hollow cathode cavities 314 corresponding to the edge 322 of the diffuser plate 300. The non-planar downstream surface 306 may be formed by machining out the downstream side of the diffuser plate 300 after the top bore 310 and hollow cathode cavities 314 have been drilled into the diffuser plate 300. The machining process leaves sharp edges 316 at the corners of the cathode cavities 314 and the downstream surface 306 of the diffuser plate 300. The angles of these sharp edges 316 varies across the corners of the cavity and also varies from cavity to cavity across the diffuser plate due to the non-planar or contoured downstream surface 306. Referring to FIG. 3B, during CVD plasma processing, unwanted deposition material 342 is deposited on the downstream surface 306 of the diffuser plate 300, the sharp corners or edges 316, and the interior walls 318 of the hollow cathode cavities 314. During plasma processing, the high film stress of the deposited material 342 at the sharp edges 316 of the corners of the cavities 314 cause the deposition material 342 at the sharp edges 316 to buckle and flake off, which can cause particles to land on the substrate and thus decrease output yield. It has also been found that removing the sharp edge 316 and rounding the corner of the hollow cathode cavity 314 at the downstream surface 306 reduces the amount of stress on the deposited material 342 during plasma processing which reduces the flaking off of particles.

Figure 4:
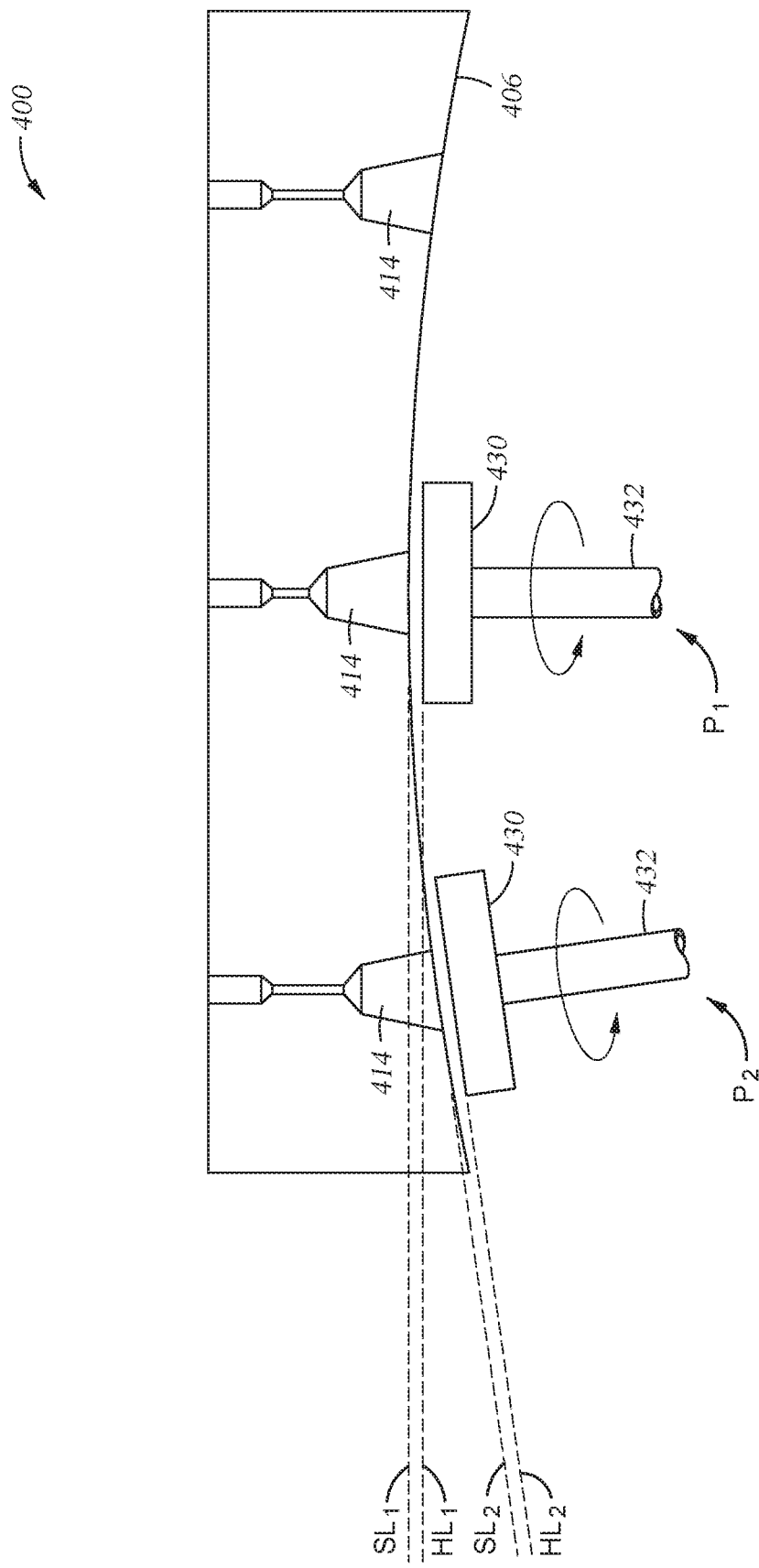
FIG. 4 is a cross-sectional schematic view of a diffuser plate showing machining heads in relation to the bottom surface.
Figure 6A:
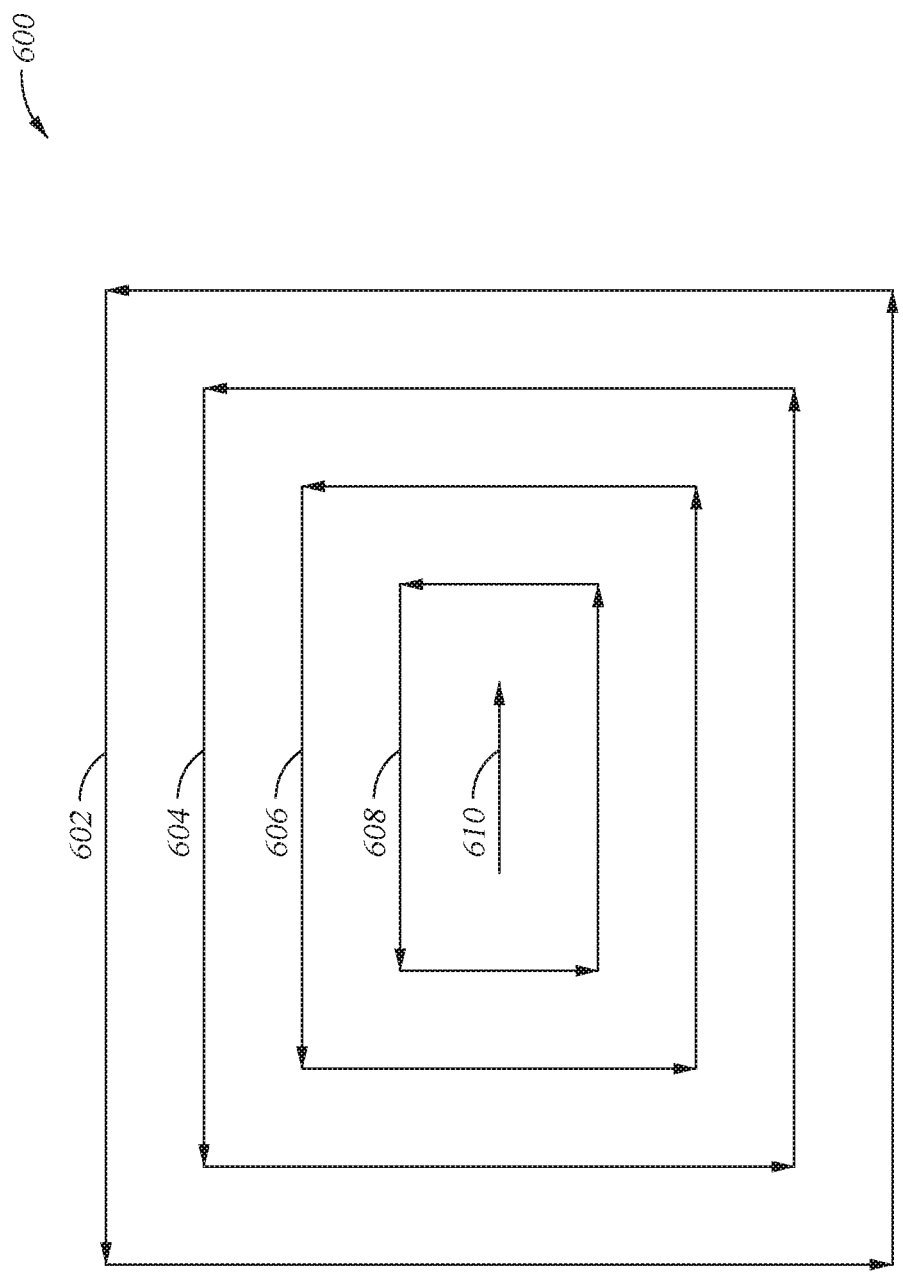
FIG. 6A depicts one embodiment of a pathway that may be programmed into computer numerical control (CNC) machine to provide for uniform coverage of the bottom surface of a rectangular diffuser by the abrasive member.
Figure 6B:
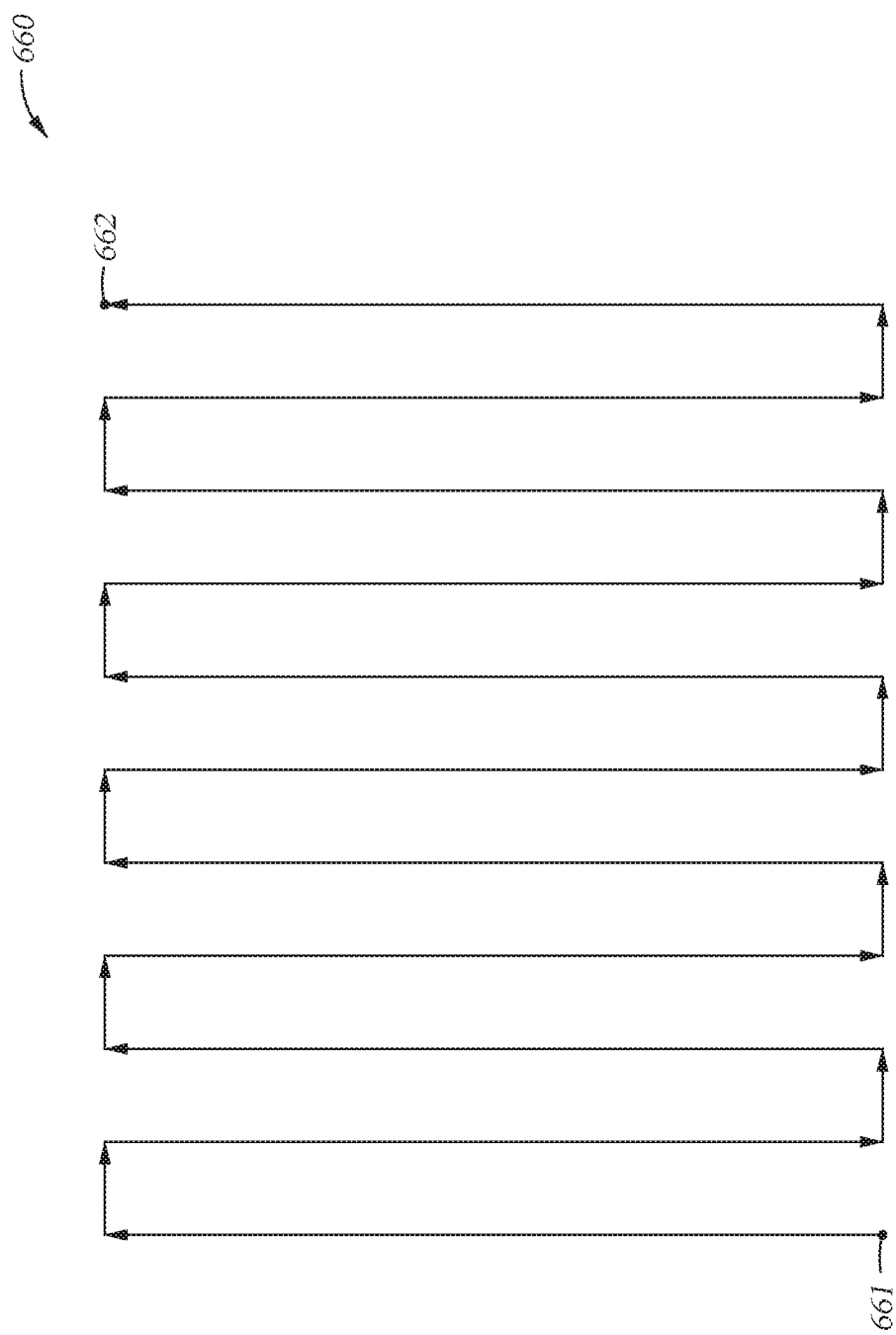
FIG. 6B depicts another embodiment of a pathway that may be programmed into the CNC to provide for uniform coverage of the bottom surface of a rectangular diffuser by the abrasive member.

FIG. 4 shows a cross-sectional schematic view of diffuser plate 400 and showing a compliant abrasive member 430 positioned in relation to the contoured downstream surface 406 and contoured edges of hollowed cathode cavities 414. The compliant abrasive member 430 is applied to downstream surface 406 to round the edges of cathode cavities 414. The compliant abrasive member 430 can be any abrasive member that has compliant properties allowing the abrasive member 430 to enter into the cathode cavity 414 and overlap with the edge of the cathode cavity 414 sufficiently to abrasively remove the sharp edge of the cathode cavity 414. Examples of compliant abrasive members include abrasive pads, abrasive brushes, abrasive buffs, abrasive wheels and abrasive discs. The abrasive pads, brushes, buffs, wheels and discs may all contain abrasive surfaces containing ceramic or silicon carbide, or combinations of the two, other abrasive materials. For example, an abrasive pad may have a contact surface that either has embedded ceramic and/or silicon carbide particles or a coating that contains ceramic and/or silicon carbide particles. The abrasive member 430 may be sufficiently wide with a surface area to cover at least one cathode cavity 414. The abrasive member 430 is attached to spindle 432. The spindle may also be a mandrel or shank. The spindle is preferably attached to a CNC machine (not shown). The CNC machine is programmed to control the pressure of the abrasive member 430 against the diffuser plate 400 together with the rotational speed, the linear speed and the path of the abrasive member across the downstream surface 406 of the diffuser plate 400. Examples of paths for the abrasive member across the diffuser plate are shown in FIGS. 6A and 6B and discussed below. In addition to rotating or spinning the abrasive member 430, the CNC machine may also, or alternatively, cause the abrasive member to be moved in an orbital motion, vibration motion or an oscillating motion.

The downstream surface 406 of the diffuser plate 400 and cathode cavity edges are contoured. Thus, to ensure that the abrasive member 430 adequately enters into the cathode cavity 414 and overlaps with the edge of the cathode cavity 414 and downstream surface 406 of the diffuser plate 400, the center axis (not shown) of the spindle 432 should be maintained approximate a fixed 90 degree angle, +/−10 degrees, to the average surface contour angles below the abrasive member 430. For example, P1 reflects the position of spindle 432 and abrasive member 430 at a first position as it would be applied to the downstream surface of the diffuser plate. SL1 reflects the average contour angles of the surface of the diffuser plate below the abrasive member 430. HL1 reflects the angle of abrasive member 430 to be properly applied to the to the bottom surface of the diffuser plate which is maintained parallel to SL1. P2 reflects the position of spindle 432 and abrasive member 430 at a second position along a path across the contoured bottom surface of the diffuser plate 400. SL2 reflects the average contour angles of the surface of the diffuser plate below the abrasive member 430 at P2. HL2 reflects the angle of abrasive member 430 which is maintained parallel to SL2. Maintaining the abrasive member 430 parallel with the average contour beneath the abrasive member 430 provides uniform rounding of the sharp edges of the cavity as the abrasive member moves across the diffuser plate.

Figure 5A:
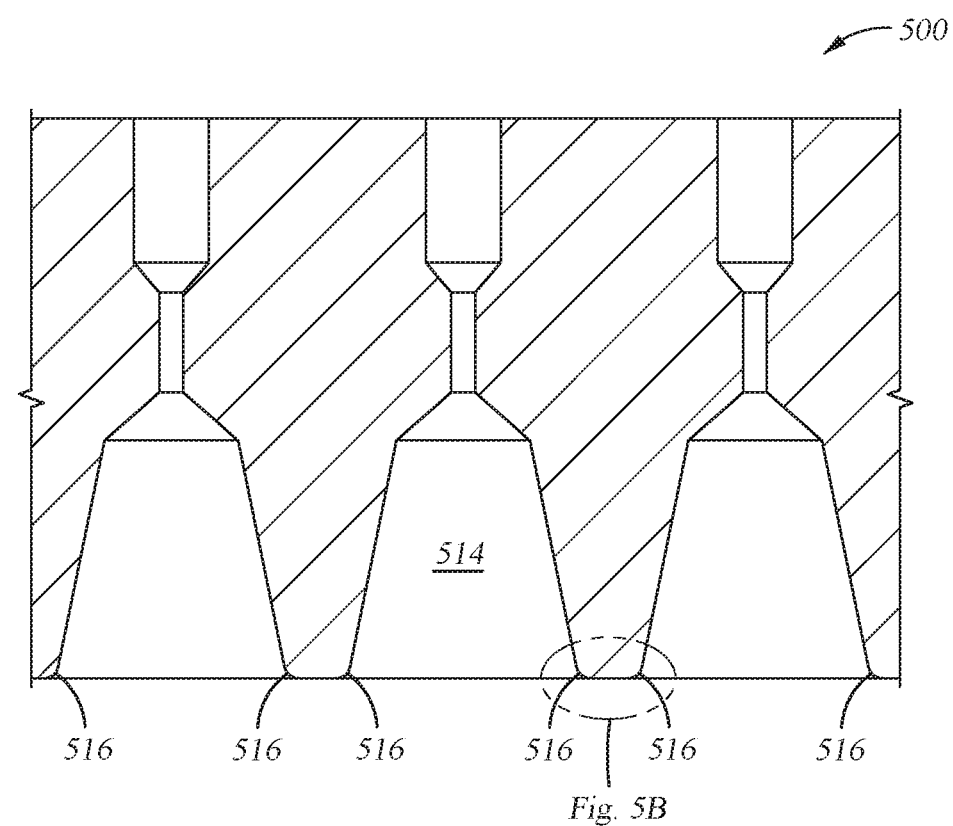
FIG. 5A is a schematic cross-sectional view of a portion of a diffuser plate according to another embodiment.
Figure 5B:
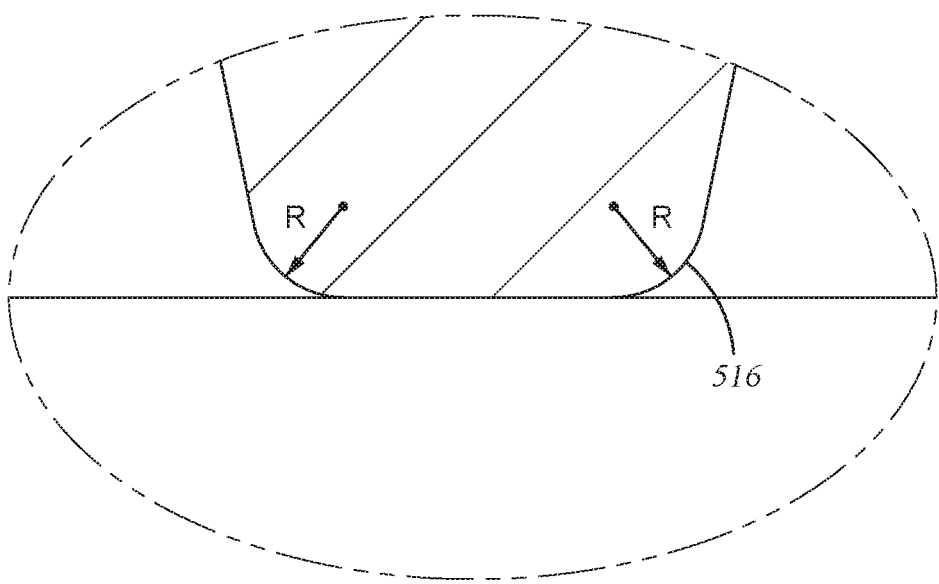
FIG. 5B is a close-up cross-sectional schematic view the rounded edges of a hollow cathode cavity depicted in FIG. 5A.

FIG. 5A shows a close-up of a portion of diffuser plate 500 with the sharp edges removed providing for rounded edges 516 of the hollowed cathode cavities 514 by an abrasive member in the manner discussed above. FIG. 5B shows a further close-up of the rounded corners. It has been found that rounded corners of the cathode cavities preferably have a radius R of between about 0.05 mm and 0.7 mm, such as between about 0.15 mm and 0.6 mm, such as between about 0.25 mm and 0.55 mm. The rounded edges with a radius in this range provides for reduced flaking and particles caused by film stress of the deposited materials adhering to the downstream surface of the diffuser plate during plasma enhanced chemical mechanical processing.

FIG. 6A shows one example of centerlines for pathways 600 that may be programmed into the CNC to provide for uniform coverage of the downstream surface of a rectangular diffuser by the abrasive member. As shown in FIG. 6A, the pathway centerlines follow a rectangular linear line that circumscribes the rectangular diffuser plate providing for progressively smaller rectangular pathways closer to the center of the diffuser plate. For example, the abrasive member follows pathway centerline 602 in a direction dictated by the arrow for a complete revolution of the pathway. Once the abrasive member completes one revolution, the abrasive member is moved to another pathway centerline, such as pathway centerline 604 to complete another revolution. The cycle continues until pathway centerline 606, pathway centerline 608 and pathway centerline 610 are all complete and the entire downstream surface of the diffuser plate was subject to the abrasive properties of the abrasive member. The distance between center lines of the pathway centerlines 602, 604, 606, 608, and 610 is determined based on the width of the abrasive member and the relative motion of the abrasive member along the pathway. For example, if the abrasive member was moved in linear direction along a pathway centerline combined with an orbital motion, the distance between centerlines would be greater than if the abrasive member was moved in a linear direction combined solely with a spinning motion.

FIG. 6B shows another example of a centerline of pathway 660 that may be programmed into the CNC machine to provide for uniform coverage of the bottom surface of a rectangular diffuser by the abrasive member. The abrasive member pathway shown in FIG. 6B provides for one continuous pathway where the abrasive member joins the pathway at the lower left corner at starting point 661 and travels the width of the rectangular diffuser plate and then turns to make a second pass adjacent the first pass along the width of the diffuser plate. The abrasive member continues along the pathway the width of the diffuser plate towards the opposite end of the diffuser plate until the abrasive member has passed over the entire downstream surface of the diffuser plate ending at finish point 662. Alternatively, the abrasive member may travel along adjacent pathways that run the length of the diffuser plate until the abrasive member has passed over the entire bottom surface of the diffuser plate. If the diffuser plate is a circular diffuser plate, the abrasive member would follow pathways that form concentric circles or concentric pathways that get progressively smaller from the outer edge to the center of the circular diffuser plate or progressively larger from the center to the outer edge of the diffuser plate.

During the process of rounding the edges of the hollow cathode cavities using an abrasive member, the abrasive qualities of the abrasive member may leave undesirable gouges and scratches on the bottom surface of the diffuser plate and the rounded edges of the cathode cavities. These scratches and gouges negatively affect the uniformity of the plasma during processing. Therefore, subsequent to rounding the edges of the cathode cavities, a polishing member is substituted for the abrasive member and applied to the bottom surface of the diffuser plate. The polishing member can be a compliant polishing pad used to remove the gouges and scratches left by the abrasive member. The compliant polishing pad is applied to the bottom surface of the diffuser plate, including the rounded corners of the cathode cavities, using a CNC machine that may use the same pathways discussed above to ensure the polishing pad is applied to the entire bottom surface of the diffuser plate. In another embodiment, the gouges and scratches may be removed using grit blasting.

Figure 7:
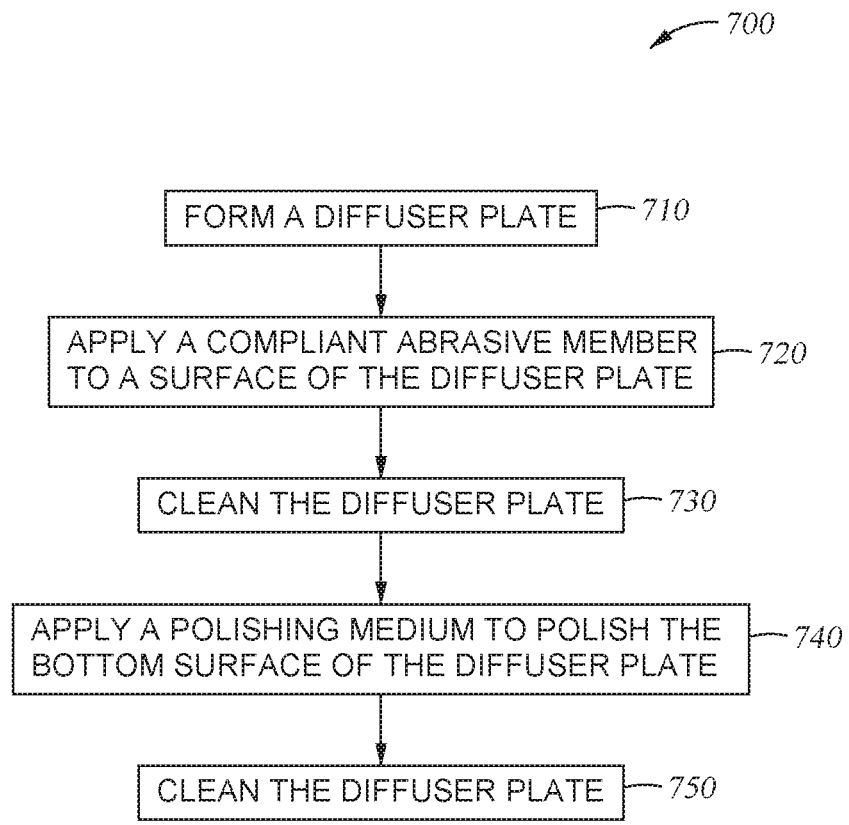
FIG. 7 shows a process flow chart for a method of rounding the corner edges of a cathode cavity in a diffuser plate.

FIG. 7 illustrates a flow chart for the cathode cavity edge rounding process 700. At block 710 a diffuser plate is formed with gas passages extending from the upstream side to the downstream side. The gas passages include a top bore drilled at the upstream side and a hollow cathode cavity drilled at the downstream side of the diffuser plate. The downstream side, or bottom surface, is then machined to provide a contour to the bottom surface that provides for gradually increasing diameters of the hollow cathode cavities from the center portion to the outer portion of the diffuser plate.

At block 720, a compliant abrasive member is applied to the contoured bottom surface of the diffuser plate to round the edges of the hollow cathode cavities. The compliant abrasive member is applied to the bottom surface of the diffuser plate with sufficient pressure to force portions of the compliant abrasive member to enter the hollow cathode cavity and remove the sharp corners at the edge of the cathode cavity and bottom surface of the diffuser plate left by the cathode cavity drilling process of block 710 resulting in a rounded edge having a radius R of between about 0.05 mm and 0.7 mm, such as between about 0.15 mm and 0.6 mm, such as between about 0.25 mm and 0.55 mm. To provide uniformity to the rounded edges across the bottom surface of the contoured bottom surface, the abrasive member may be applied to the contoured bottom surface in an orbital, spinning or oscillating manner. The compliant abrasive member may further by applied to the contoured bottom surface facilitated along predetermined pathways to ensure compliant abrasive member is applied to the entire bottom surface of the diffuser plate.

At block 730, the diffuser plate is subjected to a cleaning process to remove any dust, particles or other residuals remaining on the product after the process of block 720. The cleaning process may be an ultrasonic bath or high pressure spray with a cleaning detergent to prepare the diffuser plate for the process of block 740.

At block 740, a compliant polishing member is applied to the contoured bottom surface of the diffuser plate to remove scratches and gouges left by the application of the abrasive member during the process of block 720. These scratches and gouges negatively affect the uniformity of the plasma during processing. In another embodiment, the gouges and scratches may be removed using grit blasting.

At block 750, the diffuser plate is subjected to a cleaning process to remove any dust, particles or other residuals remaining on the product after the process of block 720. The cleaning process may be an ultrasonic bath or high pressure spray with a cleaning detergent to prepare the diffuser plate for packaging or additional manufacturing operations.

The method of rounding hollow cathode corners applies to any design of gas diffuser holes, which includes any design of hollow cathode cavity, and any shapes/sizes of gas diffuser plates. The method applies to a diffuser plate that utilizes multiple designs of gas diffuser holes, which include multiple designs of hollow cathode cavities. The method applies to diffuser plates of any curvatures and diffuser plate made of any materials, for example, aluminum (Al), tungsten (W), chromium (Cr), tantalum (Ta), or combinations thereof, among others, and by any methods, for example, cast, brazed, forged, hot iso-statically pressed or sintered. The method also applies to diffuser plates made of multiple layers of materials that are pressed or glued together.

It will also be recognized by those skilled in the art that, while the disclosure has been described above in terms of preferred embodiments, it is not limited thereto. Various features and aspects of the above-described disclosure may be used individually or jointly. Further, although the disclosure has been described in the context of its implementation in a particular environment and for particular applications, those skilled in the art will recognize that its usefulness is not limited thereto and that the present disclosure can be utilized in any number of environments and implementations.

What is claimed is:

1. A method of forming a diffuser plate comprising:
removing material with an abrasive member from a non-planar downstream surface of the diffuser plate to form a rounded corner at each of a plurality of holes formed at the non-planar downstream surface, wherein the abrasive member includes a fixed contact surface embedded with abrasive particles and the abrasive member has a surface area sufficiently wide to completely cover at least one hole of the plurality of holes, wherein the abrasive member is attached to a spindle and the spindle is maintained at a fixed 90 degree angle, +/−10 degrees, to an average surface contour of the non-planar downstream surface below the abrasive member.

2. The method of claim 1, wherein the abrasive member is compliant.

3. The method of claim 1, wherein the abrasive member is rotated.

4. The method of claim 1, wherein at least a plurality of the plurality of holes are cone shaped.

5. The method of claim 1, wherein the rounded corner at each of the plurality of holes has a radius of between 0.15 mm and 0.6 mm.

6. The method of claim 2, wherein the abrasive member is an abrasive pad.

7. The method of claim 1, further comprising cleaning the diffuser plate.

8. The method of claim 1, wherein the rounded corner at each of the plurality of holes has a radius of between 0.05 mm and 0.7 mm.

9. A method of forming a diffuser plate comprising:
forming a plurality of holes through the diffuser plate from an upstream side of the diffuser plate to a downstream side of the diffuser plate;
removing diffuser plate material from the downstream side of the diffuser plate forming a non-planar downstream surface; and
removing material with an abrasive member from the non-planar downstream surface of the diffuser plate to form a rounded corner at each of the plurality of holes formed at the non-planar downstream surface, wherein the abrasive member includes a fixed contact surface embedded with abrasive particles and the abrasive member has a surface area sufficiently wide to completely cover at least one hole of the plurality of holes, wherein the abrasive member is attached to a spindle and the spindle is maintained at a fixed 90 degree angle, +/−10 degrees, to an average surface contour of the non-planar downstream surface below the abrasive member.

10. The method of claim 9, wherein the abrasive member is compliant.

11. The method of claim 9, wherein the abrasive member is rotated.

12. The method of claim 9, wherein the rounded corner at each of the plurality of holes has a radius of between 0.15 mm and 0.6 mm.

13. The method of claim 10, wherein the abrasive member is an abrasive pad.

14. The method of claim 10, further comprising cleaning the diffuser plate.

15. The method of claim 9, wherein the rounded corner at each of the plurality of holes has a radius of between 0.05 mm and 0.7 mm.

16. A method of forming a diffuser plate comprising:
 forming a plurality of holes through the diffuser plate from an upstream side of the diffuser plate to a downstream side of the diffuser plate;
 removing diffuser plate material from the downstream side of the diffuser plate forming contoured corners at an edge of the holes; and
 removing material with an abrasive member from the downstream side of the diffuser plate to form a rounded corner at each of the contoured corners, wherein the abrasive member includes a fixed contact surface embedded with abrasive particles and the abrasive member has a surface area sufficiently wide to completely cover at least one hole of the plurality of holes, wherein the abrasive member is attached to a spindle and the spindle is maintained at a fixed 90 degree angle, +/−10 degrees, to an average surface contour of the non-planar downstream surface below the abrasive member.

17. The method of claim 16, wherein the abrasive member is compliant.

18. The method of claim 16, wherein the abrasive member is rotated.

19. The method of claim 16, wherein the rounded corner at each of the contoured corners has a radius of between 0.15 mm and 0.6 mm.

20. The method of claim 17, wherein the abrasive member is an abrasive pad.

21. The method of claim 17, further comprising cleaning the diffuser plate.

22. The method of claim 17, further comprising polishing the non-planar downstream surface of the diffuser plate.

23. The method of claim 16, wherein the rounded corner at each of the plurality of holes has a radius of between 0.05 mm and 0.7 mm.

* * * * *